United States Patent [19]

Bredthauer

[11] Patent Number: 4,742,017
[45] Date of Patent: May 3, 1988

[54] IMPLANTATION METHOD FOR FORMING SCHOTTKY BARRIER PHOTODIODES

[75] Inventor: Richard A. Bredthauer, Dana Point, Calif.

[73] Assignee: Ford Aerospace Corporation, Dearborn, Mich.

[21] Appl. No.: 876,563

[22] Filed: Jun. 20, 1986

[51] Int. Cl.$^4$ ............... H01L 21/425; H01L 29/48
[52] U.S. Cl. .................... 437/39; 437/175; 357/15; 357/17
[58] Field of Search ............. 357/15, 17; 437/39, 437/175

[56] References Cited

U.S. PATENT DOCUMENTS

| | | | |
|---|---|---|---|
| 3,757,123 | 9/1973 | Archer et al. | 357/4 X |
| 3,943,552 | 3/1976 | Shannon et al. | 357/15 |
| 3,971,057 | 7/1976 | Connors et al. | 357/30 |
| 4,096,622 | 6/1978 | MacIver | 437/39 |
| 4,242,149 | 12/1980 | King et al. | 148/1.5 |
| 4,467,340 | 8/1984 | Rode et al. | 357/24 |
| 4,496,964 | 1/1985 | Tsubouchi et al. | 357/30 |
| 4,499,483 | 2/1985 | Yamazaki et al. | 357/30 |
| 4,524,374 | 6/1985 | Denda et al. | 357/15 |
| 4,544,939 | 10/1985 | Kosonocky et al. | 357/30 |
| 4,577,396 | 3/1986 | Yamamoto et al. | 357/91 |
| 4,638,345 | 1/1987 | Elabd et al. | 357/24 |

Primary Examiner—Olik Chaudhuri
Attorney, Agent, or Firm—Peter Abolins; Keith L. Zerschling

[57] ABSTRACT

A Schottky barrier photodiode for detecting infrared radiation uses implantation of metal ions to form a metal silicide. An annular N+ type silicon guard ring is formed in a p-type silicon substrate. Metal ions are implanted into the exposed surface area of the silicon substrate surrounded by the silicon guard ring. The resulting structure is annealed to form a silicide of the implanted metal. A portion of the silicon substrate encircled by the silicon guard ring and above the metal silicide is removed. A thin oxide passivating layer is formed above the metal silicide.

1 Claim, 1 Drawing Sheet

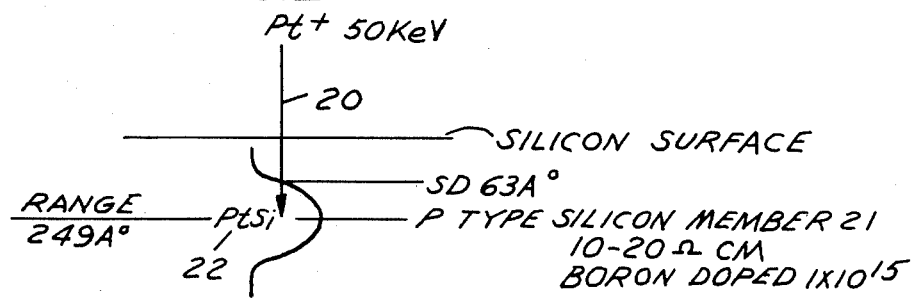
FIG.1
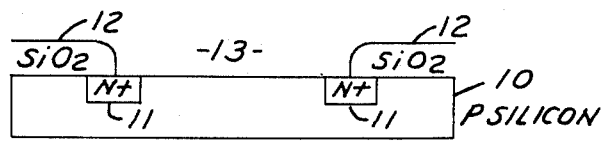
FIG.2
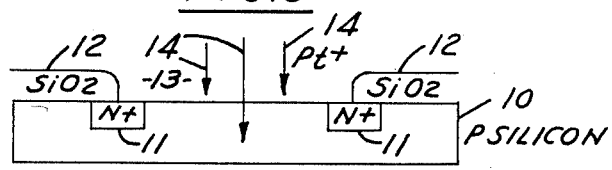
FIG.3
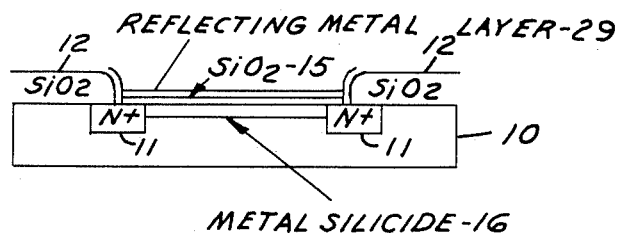
FIG.4
FIG.5
| |
|---|
| DIODE FORMATION: FORM N+ GUARD RING AROUND DIODE PERIPHERY |
| OXIDIZE SILICON AND OPEN DIODE AREA |
| IMPLANT METAL FOR SILICIDE IN OPENING |
| ANNEAL WAFER 350-800C TO FORM SILICIDE AND REMOVE IMPLANT DAMAGE |
| ETCH AWAY ANY SILICON ON THE SURFACE OF THE DIODE |
| DEPOSIT THIN OXIDE PASSIVATION AND METAL LAYER |

IMPLANTATION METHOD FOR FORMING SCHOTTKY BARRIER PHOTODIODES

BACKGROUND OF THE INVENTION

1. Field of the Invention

This invention relates to photodetectors and, more particularly, to using ion implantation to form Schottky barrier photodiodes.

2. Background of the Invention

It is known to form Schottky barrier diodes by evaporation or sputtering of a metal such as platinum, palladium, irridium, etc. onto a clean silicon wafer surface. The metal is then alloyed with the silicon at about 400° C. to about 800° C. to form the metal silicide, PtSi, $Pd_2Si$, IrSi, respectively. In using such a technique to form a diode, a significant problem is the preparation of the surface of the silicon wafer. The noble metals typically used, such as the above recited platinum, are not very reactive. If there is any oxide or other impurity on the surface of the silicon it will prevent the metal from forming a silicide and alloying. Creating a good vacuum system, capable of vacuums on the order of $10^{-9}$ torr, to prevent oxide formation at the surface of the silicon wafer is extremely difficult.

U.S. Pat. No. 4,499,483 to Yamazaki et al discloses a silicon photodiode having an n-type conductivty control layer 22 extending a distance into a silicon body 12. The n-type control layer is preferably formed by ion implantation of arsenic (As) or antimony (Sb). Thus, Yamazaki et al describe using ion implantation in the formation of silicon photodiodes sensitive to visible light. There is no teaching or suggestion how to form photodiodes sensitive to infrared radiation. A structure suitable for detecting visible radiation typically has different structural features and dimensions (e.g. thicker layers) than a structure suitable for detecting infrared radiation. Thus fabrication techniques to make one type of photodiodes would not be expected to transfer to the making of another type of diode.

U.S. Pat. No. 4,242,149 issued to King et al discloses a method of making a photodetector using ion implantation of a reactant dopant into a semiconductor substrate. In the embodiment shown in FIG. 1, a semiconductor substrate 10, such as cadmium telluride, is bombarded through a mask 11 with mercury ions. A laser is then used to heat the composite metal, allowing the mercury to combine with the cadmium telluride to form a mercury cadmium telluride photodetector. The photodetectors described are made with ion implantation only in composite material such as III-V and II-VI compounds. The techniques taught make no mention of class IV elements such as silicon and germanium. The photodetectors created are not of the Schottky barrier diode type.

U.S. Pat. No. 3,757,123 issued to Archer et al teaches metal deposition. The approach described has several drawbacks to commercial production. As mentioned above, the noble metals necessary for diode formation are very nonreactive. Any impurities on the silicon surface prior to deposition, such as silicon dioxide, prevent formation of a good quality Schottky barrier diode. This necessitates the use of very high vacuum deposition equipment which is expensive and has low throughput and poor repeatability.

U.S. Pat. No. 4,496,964 issued to Tsubouchi et al teaches a transistor and does not teach fabrication of a photodiode. As with some of the previously mentioned approaches, deposition is taught rather than implantation to form the silicide.

U.S. Pat. No. 3,971,057 issued to Connors et al teaches forming a Schottky diode by deposition. There is no mention of the thin layer required for infrared radiation detection or the use of such detectors for infrared detection.

U.S. Pat. No. 4,467,340 issued to Rode et al discusses a technique for interconnecting multiple photodetectors to suitable output circuitry in the form of a charge coupled device multiplexer. There is no description of any technique for forming a Schottky barrier photodiode array.

The above described deposition techniques for platinum as used for fabricating Schottky barrier photodiodes are often slow, expensive and nonrepeatable. This invention solves some of these aforementioned difficulties.

SUMMARY OF THE INVENTION

This invention teaches precise control of the location of species implanted in a silicon semiconductor to form Schottky barrier photodiodes suitable for detection of infrared radiation. The use of implantation alleviates the necessity of keeping the silicon surface clean. That is, implantation bypasses any surface contamination problem associated with silicon.

Further, the use of implantation permits exceeding the solubility limit of the implanted species. In contrast, surface chemistry is limited by such a solubility limit. The use of implantation also permits accurate control of the depth of implantation which is critical in forming a Schottky barrier diode. Again in contrast, the use of surface chemistry relies on the amount of diffusion to determine the amount of depth for the species. Further, surface chemistry cannot be used with some materials. That is, these materials may not diffuse or they may only diffuse at temperatures that are so high that the temperature would melt the silicon.

In summary, there are the following advantages to implanting the metal under the surface of the silicon rather than deposition the metal on the surface of the silicon. First, ultra high vacuums and straight cleanliness requirements are no longer necessary. This is because the silicide junction is formed below the surface. Second, varying the implant dose allows accurate adjustment of dopant concentration in the silicide. Thus, different silicides may be created. Third, varying the implant energy allows the adjustment of the depth of the silicide layer in the silicon. Fourth, implanting gives the flexibility to combine noble metals to tailor the infrared response characteristics. A combination of platinum and palladium silicide could be formed. This would not be easily possible by sputtering or evaporation. The implant dose can accurately control the stoichiometrics of the silicide.

The method of formation of a Schottky barrier diode in accordance with this invention includes implanting silicon with a metal, annealing the wafer in an inert gas thereby forming a buried metal silicide layer which is a Schottky barrier diode. The diode so formed, when cooled, is suitable for detection of infrared radiation.

BRIEF DESCRIPTION OF THE DRAWINGS

FIG. 1 is a schematic cross-section view of a concentration of implanted platinum at a location beneath a silicon surface;

FIGS. 2-4 are a partial, sequential schematic cross-section view of six steps of the fabrication of a Schottky barrier diode in accordance with an embodiment of this invention, including forming a doped guard ring around the diode periphery, oxidizing silicon outside the guard ring, implanting metal for the formation of a silicide in the guard ring opening, annealing the wafer, etching away silicon on the surface of the diode and depositing a thin oxide passivation layer; and FIG. 5 is a flow chart describing the sequential steps shown in FIGS. 2-4.

DETAILED DESCRIPTION OF THE INVENTION

Referring to FIG. 1, formation of a Schottky barrier infrared photodiode in accordance with an embodiment of this invention includes implanting platinum ions 20 into a silicon member 21 through a silicon surface 23. Using an implantation energy level of 50 KeV, the concentration of a platinum silicide 22 formed within silicon member 21 has a maximum concentration at a depth of about 249 angstroms below silicon surface 23. The standard deviation of the distribution of platinum silicide 22 is about 63 angstroms. Accordingly, the majority of platinum silicide 22 is situated ±180 angstroms about a distance of 249 angstroms into silicon member 21 from silicon surface 23. Silicon member 21 is typically a p-type silicon with a resistivity of about 10–20Ω per centimeter and having a boron doping concentration of about $1 \times 10^{15}$ atoms per cubic centimeter. An implant dose of about $10^{16}$ atoms per square centimeter will yield a concentration of approximately $3 \times 10^{21}$ atoms per cubic centimeter. The depth of the platinum silicide layer can be varied in the silicon by varying the implant energy. Using an implantation energy of about 10 KeV the depth of the maximum concentration of the platinum silicide is about 85 angstroms. At about 200 KeV, the depth of the maximum concentration of the platinum silicide is about 674 angstroms. At 1 MeV, the depth of the concentration is about 2597 angstroms. Such appropriate selection of fabrication can be used to form Schottky barrier photodiodes suitable for detection of infrared radiation having a wavelength in the 1 to 6 micron range.

Referring to steps 1 and 2 of FIG. 2, FIG. 3 and FIG. 5 a portion of p-type silicon 10 is used as a base in which to form an annular guard ring 11 of an N+ type conductivity. The silicon is oxidized to form a silicon dioxide layer 12 on silicon 10 and an opening 13 is formed in layer 12 for use of the diode area. In step 3 of FIG. 2, platinum ions are implanted into silicon 10 as indicated by arrows 14. As explained above, the energy with which the platinum ions are accelerated determines the depth of the platinum implantation and the distribution of the resulting platinum silicide. Step 4 of FIG. 4 and FIG. 5 indicates that the resulting wafer is annealed at a temperature of about 350° C. to 800° C. to form the platinum silicide and to remove any implant damage to the surface of silicon 10. As indicated by step 5, any silicon on top of the formed Schottky barrier diode is then etched away to expose platinum silicide 16. Advantageously, an etchant which selectively etches silicon, but not the platinum silicide is used.

Then, as indicated in step 6, a thin oxide passivation layer 15 is deposited on the platinum metal silicide 16. If desired, a reflecting metal layer 29 is formed on oxide passivation layer 15 to reflect infrared radiation. Normally, infrared radiation can enter silicon 10 from either the top or the bottom. When reflecting metal layer 29 is formed, infrared radiation advantageously enters silicon 10 from the bottom. Any infrared radiation passing through metal silicide 16 is reflected back to metal silicide 16 by reflecting metal layer 29.

Various modifications and variations will no doubt occur to those skilled in the various arts to which this invention pertains. For example, the particular metals implanted, the implantation energies, and the geometric configuration of the implantation may be varied from that disclosed herein. These and all other variations which basically rely on the teachings through which this disclosure has advanced the art are properly considered within the scope of this invention.

I claim:

1. A method of forming a Schottky barrier photodiode suitable for detection of infrared radiation includes the following sequentially ordered steps of:

forming a p-type silicon substrate with a surface area;

forming an annular N+ type silicon guard ring in the silicon substrate around a portion of the surface area of the p-type silicon substrate;

forming a silicon dioxide layer on top of the p-type silicon substrate including the silicon guard ring;

exposing the surface area of the p-type silicon substrate within the silicon guard ring;

implanting metal ions into the exposed surface area of the silicon substrate surrounded by the silicon guard ring;

annealing the resulting structure to form a silicide of the implanted metal within the silicon substrate;

removing a portion of the silicon substrate encircled by the silicon guard ring and between the surface of the silicon substrate and the formed silicide using selective etching;

depositing a thin oxide passivating layer on the silicon substrate encircled by the silicon guard ring;

depositing a reflective metal layer on said thin oxide passivating layer for reflecting infrared radiation back to the metal silicide; and wherein:

the implantation energy of the metal ions is 50 KeV, the metal ion is platinum, and a platinum silcide is formed with a distribution having a maximum concentration at a depth of about 249 angstroms below the silicon surface and having a standard deviation of about 63 angstroms;

the p-type silicon substrate has resistivity of about 10–20Ω per centimeter and is boron doped with a concentration of $1 \times 10^{15}$ atoms per cubic centimeter;

the implantation energy of the metal ions is 10 KeV and the metal silicide is formed with a distribution having a maximum concentration at a depth of about 85 angstroms; and these steps of forming the silicon guard ring, the silicon dioxide layer, the implantation of metal ions, and annealing are such that the Schottky barrier photodiode formed is suitable for detection of infrared radiation having a wavelength in the 1 to 6 micron range.

* * * * *